United States Patent
Suzuki et al.

(10) Patent No.: US 8,475,937 B2
(45) Date of Patent: Jul. 2, 2013

(54) SILICONE COMPOSITION AND ORGANIC LIGHT-EMITTING DIODE

(75) Inventors: Toshio Suzuki, Houston, TX (US); David Witker, Bay City, MI (US)

(73) Assignee: Dow Corning Corporation, Midland, MI (US)

( * ) Notice: Subject to any disclaimer, the term of this patent is extended or adjusted under 35 U.S.C. 154(b) by 507 days.

(21) Appl. No.: 12/933,916

(22) PCT Filed: Feb. 23, 2009

(86) PCT No.: PCT/US2009/034848
§ 371 (c)(1),
(2), (4) Date: Sep. 22, 2010

(87) PCT Pub. No.: WO2009/120434
PCT Pub. Date: Oct. 1, 2009

(65) Prior Publication Data
US 2011/0017986 A1    Jan. 27, 2011

Related U.S. Application Data

(60) Provisional application No. 61/039,455, filed on Mar. 26, 2008.

(51) Int. Cl.
*H01L 51/50*    (2006.01)
(52) U.S. Cl.
USPC ........ 428/690; 428/917; 257/40; 257/E51.05; 257/E51.026; 257/E51.032; 313/504; 313/505; 313/506; 548/440
(58) Field of Classification Search
USPC ....... 428/690, 917; 257/40, E51.05, E51.026, 257/E51.032; 313/504, 505, 506; 448/440
See application file for complete search history.

(56) References Cited

U.S. PATENT DOCUMENTS

| | | | |
|---|---|---|---|
| 3,419,593 | A | 12/1968 | Willing, et al. |
| 4,356,429 | A | 10/1982 | Tang |
| 4,539,507 | A | 9/1985 | VanSlyke et al. |
| 4,720,432 | A | 1/1988 | VanSlyke et al. |
| 4,769,292 | A | 9/1988 | Tang et al. |

(Continued)

FOREIGN PATENT DOCUMENTS

| | | |
|---|---|---|
| EP | 0771805 B1 | 5/1997 |
| WO | 9501871 | 1/1995 |

OTHER PUBLICATIONS

Hadziioannou et al., Tuning of the Luminescene in Multiblock Alternating Copolymers. 1. Sunthesis and Spectroscopy of Poly[(silanylene)thiophene]s, 1995, Macromolecules, vol. 28, pp. 8102-8116.*

(Continued)

*Primary Examiner* — Jennifer Chriss
*Assistant Examiner* — Gregory Clark
(74) *Attorney, Agent, or Firm* — Larry A. Milco

(57) ABSTRACT

A silicone composition comprising (A) a hydrolysis product prepared by reacting at least one thiophenyl-substituted silane and a cross-linking agent with water in the presence of an organic solvent to form an organic phase containing the hydrolysis product and an aqueous phase, and separating the organic phase from the aqueous phase, and (B) an organic solvent; and an organic light-emitting diode (OLED) containing a hole-transport/hole-injection layer comprising a cured polysiloxane prepared by applying the aforementioned silicone composition to form a film and curing the film.

10 Claims, 1 Drawing Sheet

U.S. PATENT DOCUMENTS

| | | | |
|---|---|---|---|
| 4,888,211 A | 12/1989 | Oka et al. | |
| 5,247,190 A | 9/1993 | Friend et al. | |
| 5,353,632 A * | 10/1994 | Nakagawa | 73/105 |
| 5,461,166 A * | 10/1995 | Mino et al. | 549/4 |
| 5,593,788 A | 1/1997 | Shi et al. | |
| 5,712,360 A | 1/1998 | Kobayashi et al. | |
| 5,807,627 A | 9/1998 | Friend et al. | |
| 5,952,778 A | 9/1999 | Haskal et al. | |
| 5,969,474 A | 10/1999 | Arai | |
| 6,048,573 A | 4/2000 | Tang et al. | |
| 6,255,774 B1 | 7/2001 | Pichler | |
| 6,361,885 B1 | 3/2002 | Chou | |
| 6,517,958 B1 | 2/2003 | Sellinger et al. | |
| 6,554,670 B1 | 4/2003 | Eto | |
| 2002/0004577 A1 | 1/2002 | Biebuyck et al. | |
| 2003/0129451 A1 | 7/2003 | Nukada et al. | |
| 2008/0008954 A1 | 1/2008 | Abdallah et al. | |

OTHER PUBLICATIONS

JP 2000-306669, published Nov. 2, 2000, Canon Inc. Abstract only.
JP 2000-315584, published Nov. 14, 2000, Asahi Chem Ind. Co. Ltd. Abstract only.

* cited by examiner

SILICONE COMPOSITION AND ORGANIC LIGHT-EMITTING DIODE

CROSS REFERENCE TO RELATED APPLICATIONS

This application is a U.S. national stage filing under 35 U.S.C. §371 of PCT Application No. PCT/US09/034848 filed on 23 Feb. 2009, currently pending, which claims the benefit of U.S. Provisional Patent Application No. 61/039,455 filed 26 Mar. 2008 under 35 U.S.C. §119 (e). PCT Application No. PCT/US09/034848 and U.S. Provisional Patent Application No. 61/039,455 are hereby incorporated by reference.

FIELD OF THE INVENTION

The present invention relates to a silicone composition and more particularly to a silicone composition comprising (A) a hydrolysis product prepared by reacting at least one thiophenyl-substituted silane and a cross-linking agent with water in the presence of an organic solvent to form an organic phase containing the hydrolysis product and an aqueous phase, and separating the organic phase from the aqueous phase; and (B) an organic solvent. The present invention also relates to an organic light-emitting diode (OLED) containing a hole-transport/hole-injection layer comprising a cured polysiloxane prepared by applying the aforementioned silicone composition to form a film and curing the film.

BACKGROUND OF THE INVENTION

Organic light-emitting diodes (OLEDs) are useful in a variety of consumer products, such as watches, telephones, lap-top computers, pagers, cellular phones, digital video cameras, DVD players, and calculators. Displays containing light-emitting diodes have numerous advantages over conventional liquid-crystal displays (LCDs). For example, OLED displays are thinner, consume less power, and are brighter than LCDs. Also, unlike LCDs, OLED displays are self-luminous and do not require backlighting. Furthermore, OLED displays have a wide viewing angle, even in bright light. As a result of these combined features, OLED displays are lighter in weight and take up less space than LCD displays.

OLEDs typically comprise a light-emitting element interposed between an anode and a cathode. The light-emitting element typically comprises a stack of thin organic layers comprising a hole-transport layer, an emissive layer, and an electron-transport layer. However, OLEDs can also contain additional layers, such as a hole-injection layer and an electron-injection layer. Furthermore, the emissive layer can contain a fluorescent dye or dopant to enhance the electroluminescent efficiency of the OLED and control color output.

Although a variety of organic polymers can be used to prepare the hole transport layer in an OLED, poly(3,4-ethylenedioxythiophene)poly(styrenesulfonate), PDOT:PSS, is a preferred hole-transport material. OLEDs containing this material typically have a low turn-on voltage and high brightness. However, a hole-transport layer comprising PDOT:PSS has many limitations including low transparency, high acidity, susceptibility to electrochemical de-doping (migration of dopant from hole-transport layer) and electrochemical decomposition. Moreover, PDOT:PSS is insoluble in organic solvents and aqueous emulsions of the polymer, used to prepare the hole-transport layer, have limited stability. Consequently, there is a need for an OLED comprising a hole-transport layer that overcomes the aforementioned limitations.

SUMMARY OF THE INVENTION

The present invention is directed to a silicone composition comprising:

(A) a hydrolysis product prepared by reacting (a) at least one thiophenyl-substituted silane having the formula Th—$(CH_2)_{m+2}SiR^1{}_nX_{3-n}$, and (b) a cross-linking agent selected from (i) at least one silane having the formula $(R^3{}_bSiX_{4-b})$, (ii) at least one organic compound having an average of at least two silyl groups per molecule, wherein the silyl groups have the formula —$SiR^3{}_cX_{3-c}$, and (iii) a mixture comprising (i) and (ii), with water in the presence of an organic solvent to form an organic phase containing the hydrolysis product and an aqueous phase, and separating the organic phase from the aqueous phase, wherein $R^1$ is $C_1$ to $C_{10}$ hydrocarbyl free of aliphatic unsaturation, X is a hydrolysable group, Th is thiophenyl or substituted thiophenyl, $R^3$ is $C_1$ to $C_{10}$ hydrocarbyl or —H, m is 0 to 10, n is 0, 1, or 2, b is 0 or 1, and c is 0, 1, or 2; and (B) an organic solvent.

The present invention is also directed to an organic light-emitting diode comprising:

a substrate having a first opposing surface and a second opposing surface;

a first electrode layer overlying the first opposing surface;

a light-emitting element overlying the first electrode layer, the light-emitting element comprising an emissive/electron-transport layer, and a hole-transport/hole-injection layer, wherein the hole-transport/hole-injection layer comprises a cured polysiloxane prepared by applying a silicone composition to form a film and curing the film, wherein the silicone composition comprises (A) a hydrolysis product prepared by reacting (a) at least one thiophenyl-substituted silane having the formula Th—$(CH_2)_{m+2}SiR^1{}_nX_{3-n}$, and (b) a cross-linking agent selected from (i) at least one silane having the formula $(R^3{}_b SiX_{4-b})$, (ii) at least one organic compound having an average of at least two silyl groups per molecule, wherein the silyl groups have the formula —$SiR^3{}_cX_{3-c}$, and (iii) a mixture comprising (i) and (ii), with water in the presence of an organic solvent to form an organic phase containing the hydrolysis product and an aqueous phase, and separating the organic phase from the aqueous phase, wherein $R^1$ is $C_1$ to $C_{10}$ hydrocarbyl free of aliphatic unsaturation, X is a hydrolysable group, Th is thiophenyl or substituted thiophenyl, $R^3$ is $C_1$ to $C_{10}$ hydrocarbyl or —H, m is 0 to 10, n is 0, 1, or 2, b is 0 or 1, and c is 0, 1, or 2; and (B) an organic solvent; and a second electrode layer overlying the light-emitting element.

The OLED of the present invention has a low turn-on voltage and high brightness. Also, the hole-transport/hole-injection layer of the present invention, which comprises a cured polysiloxane, exhibits high transparency and a neutral pH. Moreover, the hydrolysis product in the silicone composition used to prepare the hole-transport/hole-injection layer is soluble in organic solvents, and the composition has good stability in the absence of moisture.

The organic light-emitting diode of the present invention is useful as a discrete light-emitting device or as the active element of light-emitting arrays or displays, such as flat panel displays. OLED displays are useful in a number of devices, including watches, telephones, lap-top computers, pagers, cellular phones, digital video cameras, DVD players, and calculators.

These and other features, aspects, and advantages of the present invention will become better understood with reference to the following description, appended claims, and accompanying drawings.

DETAILED DESCRIPTION OF THE INVENTION

Figure 1:
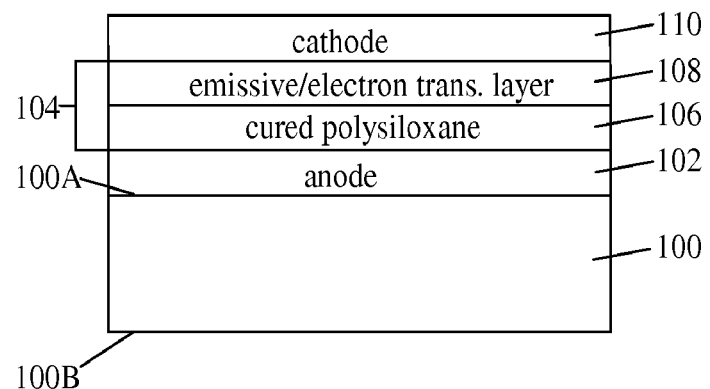
FIG. 1 shows a cross-sectional view of a first embodiment of an OLED according to the present invention.
Figure 2:
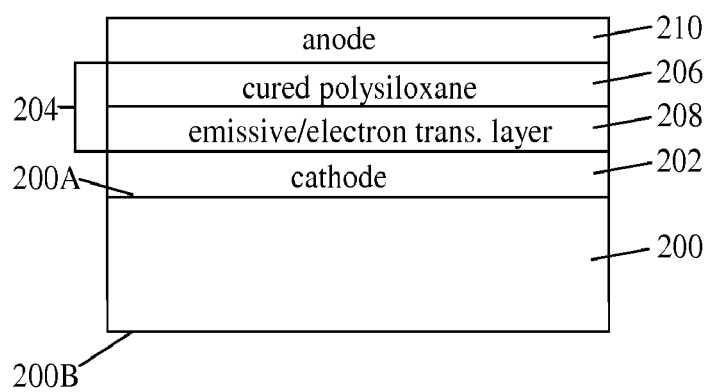
FIG. 2 shows a cross-sectional view of a second embodiment of an OLED according to the present invention.

As used herein, the term "overlying" used in reference to the position of the first electrode layer, light-emitting element, and second electrode layer relative to the designated component means the particular layer either lies directly on the component or lies above the component with one or more intermediate layers there between, provided the OLED is oriented with the substrate below the first electrode layer as shown in FIGS. 1 and 2. For example, the term "overlying" used in reference to the position of the first electrode layer relative to the first opposing surface of the substrate in the OLED means the first electrode layer either lies directly on the surface or is separated from the surface by one or more intermediate layers.

A silicone composition according to the present invention comprises:

(A) a hydrolysis product prepared by reacting (a) at least one thiophenyl-substituted silane having the formula Th—$(CH_2)_{m+2}SiR^1{}_nX_{3-n}$, and (b) a cross-linking agent selected from (i) at least one silane having the formula $(R^3{}_bSiX_{4-b})$, (ii) at least one organic compound having an average of at least two silyl groups per molecule, wherein the silyl groups have the formula —$SiR^3{}_cX_{3-c}$, and (iii) a mixture comprising (i) and (ii), with water in the presence of an organic solvent to form an organic phase containing the hydrolysis product and an aqueous phase, and separating the organic phase from the aqueous phase, wherein $R^1$ is $C_1$ to $C_{10}$ hydrocarbyl free of aliphatic unsaturation, X is a hydrolysable group, Th is thiophenyl or substituted thiophenyl, $R^3$ is $C_1$ to $C_{10}$ hydrocarbyl or —H, m is 0 to 10, n is 0, 1, or 2, b is 0 or 1, and c is 0, 1, or 2; and (B) an organic solvent.

Component (A) of the silicone composition is a hydrolysis product prepared by reacting (a) at least one thiophenyl-substituted silane having the formula Th—$(CH_2)_{m+2}SiR^1{}_nX_{3-n}$, and (b) a cross-linking agent selected from (i) at least one silane having the formula $(R^3{}_bSiX_{4-b})$, (ii) at least one organic compound having an average of at least two silyl groups per molecule, wherein the silyl groups have the formula —$SiR^3{}_cX_{3-c}$, and (iii) a mixture comprising (i) and (ii), with water in the presence of an organic solvent to form an organic phase containing the hydrolysis product and an aqueous phase, and separating the organic phase from the aqueous phase, wherein $R^1$ is $C_1$ to $C_{10}$ hydrocarbyl free of aliphatic unsaturation, X is a hydrolysable group, Th is thiophenyl or substituted thiophenyl, $R^3$ is $C_1$ to $C_{10}$ hydrocarbyl or —H, m is 0 to 10, n is 0, 1, or 2, b is 0 or 1, and c is 0, 1, or 2.

The thiophenyl-substituted silane (a) is at least one thiophenyl-substituted silane having the formula Th—$(CH_2)_{m+2}SiR^1{}_nX_{3-n}$, wherein $R^1$ is $C_1$ to $C_{10}$ hydrocarbyl free of aliphatic unsaturation, X is a hydrolysable group, Th is thiophenyl or substituted thiophenyl, m is 0 to 10, and n is 0, 1, or 2. Alternatively, the subscript m has a value of from 0 to 5 or from 1 to 3.

The hydrocarbyl groups represented by $R^1$ are free of aliphatic unsaturation and typically have from 1 to 10 carbon atoms, alternatively from 1 to 6 carbon atoms. The term "free of aliphatic unsaturation" means the group is free of aliphatic carbon-carbon double bonds and aliphatic carbon-carbon triple bonds. Acyclic hydrocarbyl groups containing at least 3 carbon atoms can have a branched or unbranched structure. Examples of hydrocarbyl groups represented by $R^1$ include, but are not limited to, alkyl, such as methyl, ethyl, propyl, 1-methylethyl, butyl, 1-methylpropyl, 2-methylpropyl, 1,1-dimethylethyl, pentyl, 1-methylbutyl, 1-ethylpropyl, 2-methylbutyl, 3-methylbutyl, 1,2-dimethylpropyl, 2,2-dimethylpropyl, hexyl, heptyl, octyl, nonyl, and decyl; cycloalkyl, such as cyclopentyl, cyclohexyl, and methylcyclohexyl; aryl, such as phenyl and naphthyl; alkaryl, such as tolyl and xylyl; and aralkyl, such as benzyl and phenethyl.

In the formula of the thiophenyl-substituted silane (a), X denotes a hydrolysable group. As used herein the term "hydrolysable group" means the silicon-bonded group reacts with water in either the presence or absence of a catalyst at any temperature from room temperature (~23±2° C.) to 100° C. within several minutes, for example thirty minutes, to form a silanol (Si—OH) group. Examples of hydrolysable groups represented by X include, but are not limited to, —Cl, —Br, —$OR^2$, —$OCH_2CH_2OR^2$, $CH_3C(=O)O$—, $Et(Me)C=N$—O—, $CH_3C(=O)N(CH_3)$—, and —$ONH_2$, wherein $R^2$ is $C_1$ to $C_8$ hydrocarbyl or $C_1$ to $C_8$ halogen-substituted hydrocarbyl, both free of aliphatic unsaturation.

The hydrocarbyl and halogen-substituted hydrocarbyl groups represented by $R^2$ are free of aliphatic unsaturation and typically have from 1 to 8 carbon atoms, alternatively from 3 to 6 carbon atoms. Acyclic hydrocarbyl and halogen-substituted hydrocarbyl groups containing at least 3 carbon atoms can have a branched or unbranched structure. Examples of hydrocarbyl groups include, but are not limited to, unbranched and branched alkyl, such as methyl, ethyl, propyl, 1-methylethyl, butyl, 1-methylpropyl, 2-methylpropyl, 1,1-dimethylethyl, pentyl, 1-methylbutyl, 1-ethylpropyl, 2-methylbutyl, 3-methylbutyl, 1,2-dimethylpropyl, 2,2-dimethylpropyl, hexyl, heptyl, and octyl; cycloalkyl, such as cyclopentyl, cyclohexyl, and methylcyclohexyl; phenyl; alkaryl, such as tolyl and xylyl; and aralkyl, such as benzyl and phenethyl. Examples of halogen-substituted hydrocarbyl groups include, but are not limited to, 3,3,3-trifluoropropyl, 3-chloropropyl, chlorophenyl, and dichlorophenyl.

In the formula of the thiophenyl-substituted silane (a), Th denotes a thiophenyl group or substituted thiophenyl group. As used herein, the term "thiophenyl" refers to a monovalent organic group containing a least one 5-membered heteroaromatic ring having the heteroatom sulfur and a free valence at a ring carbon atom. Examples of thiophenyl groups represented by Th include, but are not limited to, groups having the following formulae:

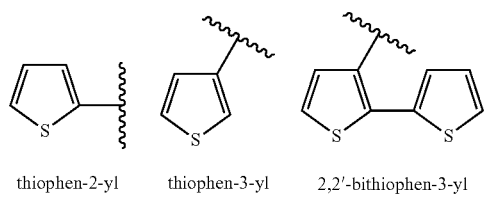

thiophen-2-yl     thiophen-3-yl     2,2'-bithiophen-3-yl

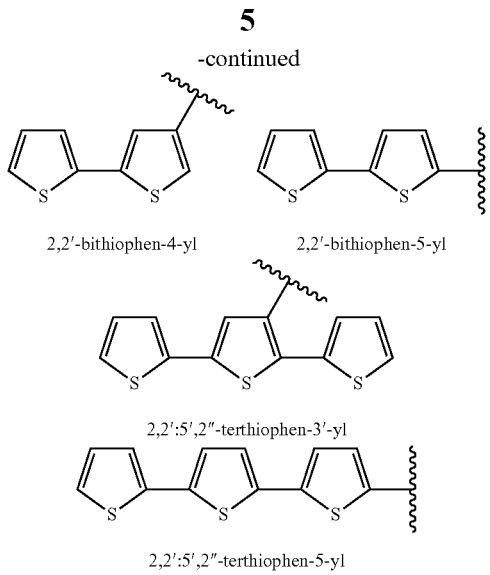

2,2′-bithiophen-4-yl        2,2′-bithiophen-5-yl 2,2′:5′,2″-terthiophen-3′-yl 2,2′:5′,2″-terthiophen-5-yl Furthermore, the term "substituted thiophenyl" means the thiophenyl group, described above, has a substituent replacing hydrogen on one or more positions of one or more heteroaromatic rings. Examples of substituents include, but are not limited to, alkyl such as methyl, ethyl, propyl, butyl, pentyl, and hexyl; aryl such as phenyl; and halo such as chloro and bromo.

The thiophenyl-substituted silane (a) can be a single silane or a mixture comprising two or more different thiophenyl-substituted silanes, each as described and exemplified above.

The thiophenyl-substituted silane can be prepared by reacting (i) an alkenyl-substituted thiophene having the formula Th—$(CH_2)_m$CH=$CH_2$ with (ii) a silane having the formula $HR^1{}_nSiX_{3-n}$ in the presence of (iii) a hydrosilylation catalyst and, optionally, (iv) an organic solvent, wherein $R^1$, Th, X, m, and n are as defined and exemplified above for the thiophenyl-substituted silane.

The alkenyl-substituted thiophene (i) has the formula Th—$(CH_2)_m$CH=$CH_2$ wherein Th and m are as defined and exemplified above for the thiophenyl-substituted silane. Examples of alkenyl-substituted thiophenes include, but are not limited to, 2-vinylthiophene, 3-vinylthiophene, 2-allylthiophene, 3-allylthiophene, 4-methyl-2-vinylthiophene, 3-methyl-2-vinylthiophene, 2-methyl-3-vinylthiophene, 5-methyl-2-vinylthiophene, 5-vinyl-2,2′-bithiophene, 3-(2-propenyl)-2,2′-bithiophene, 5-(2-propenyl)-2,2′-bithiophene, 5-vinyl-2,2′:5′,2″-terthiophene, 3′-vinyl-2,2′:5′,2″-terthiophene, and 5-ethyl-5″-vinyl-2,2′:5′,2″-terthiophene. Moreover, methods of preparing alkenyl-substituted thiophenes are well known in the art.

The silane (ii) has the formula $HR^1{}_nSiX_{3-n}$ wherein $R^1$, X, and n are as defined and exemplified above for the thiophenyl-substituted silane. Example of silanes suitable for use as silane (ii) include, but are not limited to, halosilanes such as $HSiCl_3$, $HSiBr_3$, $HMeSiCl_2$, $HEtSiCl_2$, $HMeSiBr_2$, $HEtSiBr_2$, $HPhSiCl_2$, $HPhSiBr_2$, $BuHSiCl_2$, and i-$PrHSiCl_2$, $HMe_2SiCl$, $HMe_2SiBr$, $HEt_2SiCl$, and $HEt_2SiBr$; alkoxysilanes such as $HSi(OMe)_3$, $HSi(OEt)_3$, $HSi(OPr)_3$, $HSi(OBu)_3$, $HSi(OCH_2CH_2OCH_3)_3$, $HMeSi(Me)_2$, $HMeSi(OEt)_2$, $HMeSi(OPr)_2$, $HMeSi(OBu)_2$, $HPhSi(OMe)_2$, $HPhSi(OEt)_2$, $HMeSi(OCH_2CH_2OCH_3)_2$, $HPhSi(OCH_2CH_2OCH_3)_2$, $HMe_2Si(OMe)$, $HMe_2Si(OEt)$, $HMe_2Si(OPr)$, $HMe_2Si(OBu)$, $HPh_2Si(OMe)$, $HPh_2Si(OEt)$, $HMe_2Si(OCH_2CH_2OCH_3)$, $HPh_2Si(OCH_2CH_2OCH_3)$, $HEt_2Si(OMe)$, and $HEt_2Si(OEt)$; organoacetoxysilanes such as $HMeSi(OCOCH_3)_3$, $CH_3CH_2Si(OCOCH_3)_3$, and $CH_2$=$CHSi(OCOCH_3)_3$; organoiminooxysilanes such as $HSi[O—N$=$C(CH_3)CH_2CH_3]_3$; organoacetamidosilanes such as $HSi[NHC($=$O)CH_3]_3$ and $HSi[NHC($=$O)CH_3]_3$; amino silanes such as $HSi[NH(s-C_4H_9)]_3$ and $HSi(NHC_6H_{11})_3$; and organoaminooxysilanes, wherein Me is methyl, Et is ethyl, Pr is propyl, Bu is butyl, and Ph is phenyl.

Methods of preparing silanes having hydrolysable groups are well known in the art; many of these compounds are commercially available.

The hydrosilylation catalyst (iii) can be any of the well-known hydrosilylation catalysts comprising a platinum group metal (i.e., platinum, rhodium, ruthenium, palladium, osmium and iridium) or a compound containing a platinum group metal. Preferably, the platinum group metal is platinum, based on its high activity in hydrosilylation reactions.

Preferred hydrosilylation catalysts include the complexes of chloroplatinic acid and certain vinyl-containing organosiloxanes disclosed by Willing in U.S. Pat. No. 3,419,593, which is hereby incorporated by reference. A preferred catalyst of this type is the reaction product of chloroplatinic acid and 1,3-diethenyl-1,1,3,3-tetramethyldisiloxane.

The organic solvent (iv) is at least one organic solvent. The organic solvent can be any aprotic or dipolar aprotic organic solvent that does not react with the alkenyl-substituted thiophene (i), the silane (ii), or the thiophenyl-substituted silane product under the conditions of the present method, and is miscible with components (i), (ii), and the thiophenyl-substituted silane.

Examples of organic solvents include, but are not limited to, saturated aliphatic hydrocarbons such as n-pentane, hexane, n-heptane, isooctane and dodecane; cycloaliphatic hydrocarbons such as cyclopentane and cyclohexane; aromatic hydrocarbons such as benzene, toluene, xylene and mesitylene; cyclic ethers such as tetrahydrofuran (THF) and dioxane; ketones such as methyl isobutyl ketone (MIBK); halogenated alkanes such as trichloroethane; and halogenated aromatic hydrocarbons such as bromobenzene and chlorobenzene. Organic solvent (iv) can be a single organic solvent or a mixture comprising two or more different organic solvents, each as defined above.

The reaction of the alkenyl-substituted thiophene (i) with the silane (ii) can be carried out in any standard reactor suitable for hydrosilylation reactions. Suitable reactors include glass and Teflon-lined glass reactors. Preferably, the reactor is equipped with a means of agitation, such as stirring. Also, preferably, the reaction is carried out in an inert atmosphere, such as nitrogen or argon, in the absence of moisture.

The alkenyl-substituted thiophene (i), silane (ii), hydrosilylation catalyst (iii), and, optionally, organic solvent (iv) can be combined in any order. Typically, the silane (ii) is added to a mixture of the alkenyl-substituted thiophene, hydrosilylation catalyst, and, optionally, organic solvent.

The reaction is typically carried out at a temperature of from 50 to 120° C., alternatively from room temperature (~23±2° C.) to 70° C. When the temperature is less than room temperature, the rate of reaction is typically very slow.

The reaction time depends on several factors, such as the structures of the alkenyl-substituted thiophene (i) and the silane (ii), and the temperature. The time of reaction is typically from 2 to 4 h at a temperature of from 50 to 70° C. The optimum reaction time can be determined by routine experimentation using the methods set forth in the Examples section below.

The ratio of the number of moles of the silane (ii) to the number of moles of the alkenyl-substituted thiophene (i) is typically from 1 to 5, alternatively from 1 to 3, alternatively from 1 to 2. Alternatively, the alkneyl-substituted thiophene may be used in excess relative to the silane.

The concentration of hydrosilylation catalyst (iii) is sufficient to catalyze the addition reaction of the alkenyl-substituted thiophene (i) with the silane (ii). Typically, the concentration of hydrosilylation catalyst is sufficient to provide from 0.1 to 1000 ppm of a platinum group metal, alternatively from 1 to 500 ppm of a platinum group metal, alternatively from 5 to 150 ppm of a platinum group metal, based on the combined weight of the alkenyl-substituted thiophene (i) and the silane (ii). The rate of reaction is very slow below 0.1 ppm of platinum group metal. The use of more than 1000 ppm of platinum group metal results in no appreciable increase in reaction rate, and is therefore uneconomical.

The concentration of organic solvent (iv) is typically from 10 to 70% (w/w), alternatively from 20 to 50% (w/w), alternatively from 30 to 40% (w/w), based on the total weight of the reaction mixture.

The thiophenyl-substituted silane can be recovered from the reaction mixture using conventional separation/purification methods, such as distillation and chromatography.

The cross-linking agent (b) is selected from (i) at least one silane having the formula $(R^3{}_bSiX_{4-b})$, (ii) at least one organic compound having an average of at least two silyl groups per molecule, wherein the silyl groups have the formula $—SiR^3{}_cX_{3-c}$, and (iii) a mixture comprising (i) and (ii), wherein X is a hydrolysable group, $R^3$ is $C_1$ to $C_{10}$ hydrocarbyl or —H, b is 0 or 1, and c is 0, 1, or 2.

Cross-linking agent (b)(i) is at least one silane having the formula $(R^3{}_bSiX_{4-b})$, where X, and b are as defined and exemplified above and $R^3$ is $C_1$ to $C_{10}$ hydrocarbyl or —H. The hydrocarbyl groups represented by $R^3$ typically have from 1 to 10 carbon atoms, alternatively from 1 to 6 carbon atoms, alternatively 1 to 4 carbon atoms. Acyclic hydrocarbyl and halogen-substituted hydrocarbyl groups containing at least 3 carbon atoms can have a branched or unbranched structure. Examples of hydrocarbyl groups include, but are not limited to, alkyl, such as methyl, ethyl, propyl, 1-methylethyl, butyl, 1-methylpropyl, 2-methylpropyl, 1,1-dimethylethyl, pentyl, 1-methylbutyl, 1-ethylpropyl, 2-methylbutyl, 3-methylbutyl, 1,2-dimethylpropyl, 2,2-dimethylpropyl, hexyl, heptyl, octyl, nonyl, and decyl; cycloalkyl, such as cyclopentyl, cyclohexyl, and methylcyclohexyl; aryl, such as phenyl and naphthyl; alkaryl, such as tolyl and xylyl; aralkyl, such as benzyl and phenethyl; alkenyl, such as vinyl, allyl, and propenyl; arylalkenyl, such as styryl and cinnamyl; and alkynyl, such as ethynyl and propynyl.

Examples of silanes suitable for use as cross-linking agent (b)(i), include, but are not limited to, silanes having the following formulae: $SiCl_4$, $SiBr_4$, $Si(OMe)_4$, $Si(OEt)_4$, $MeSiCl_3$, $MeSiBr_3$, $MeSi(OMe)_3$, $EtSiCl_3$, $EtSiBr_3$, $EtSi(OMe)_3$, $MeSi(OEt)_3$, $EtSi(OEt)_3$, $PhSiCl_3$, $PhSiBr_3$, $PhSi(OMe)_3$, and $PhSi(OEt)_3$.

The cross-linking agent (b)(i) can be a single silane or a mixture comprising two or more different silanes, each having the formula $(R^3{}_bSiX_{4-b})$, wherein $R^3$, X, and b are as defined and exemplified above. Moreover, methods of preparing silanes having hydrolysable groups are well known in the art; many of these compounds are commercially available.

The cross-linking agent (b)(ii) is at least one organic compound having an average of at least two silyl groups per molecule, wherein the silyl groups have the formula $—SiR^3{}_cX_{3-c}$, wherein $R^3$, X, and c are as defined and exemplified above. The organic compound can be a discrete compound or a polymer.

Examples of organic compounds suitable for use as cross-linking agent (b)(ii), include, but are not limited to organic compounds having the formulae $R^4(SiR^3{}_cX_{3-c})_2$, $R^5(SiR^3{}_cX_{3-c})_3$, and $R^6(SiR^3{}_cX_{3-c})_4$, wherein $R^3$, X, and c are as defined and exemplified above, $R^4$ is a divalent organic group, $R^5$ is a trivalent organic group, and $R^6$ is a tetravalent organic group. Examples of divalent organic groups include, but are not limited to, hydrocarbylene and carbazolediyl. The hydrocarbylene groups represented by $R^4$ typically have from 1 to 10 carbon atoms, alternatively from 1 to 6 carbon atoms, alternatively 1 to 4 carbon atoms. Examples of hydrocarbylene groups include, but are not limited to, alkylene such as methylene, ethylene, propane-1,3-diyl, 2-methylpropane-1,3-diyl, butane-1,4-diyl, butane-1,3-diyl, pentane-1,5-diyl, pentane-1,4-diyl, hexane-1,6-diyl, octane-1,8-diyl, and decane-1,10-diyl; cycloalkylene such as cyclohexane-14-diyl; and arylene such as 1,2-phenylene, 1,3-phenylene, and 1,4-phenylene. Examples of carbazolediyl groups include, but are not limited to, carbazole-1,9-diyl, carbazole-2,9-diyl, carbazole-3,9-diyl, carbazole-4,9-diyl, carbazole-2,7-diyl, carbazole-3,6-diyl, 9-methylcarbazole-2,7-diyl, 9-methylcarbazole-3,6-diyl, 9-ethylcarbazole-2,7-diyl, 9-ethylcarbazole-3,6-diyl, 9-propylcarbazole-2,7-diyl, 9-propylcarbazole-3,6-diyl, 9-butylcarbazole-2,7-diyl, 9-butylcarbazole-3,6-diyl, 9-phenylcarbazole-2,7-diyl, and 9-phenylcarbazole-3,6-diyl.

Examples of organic compounds having the formula $R^4(SiR^3{}_cX_{3-c})_2$ wherein $R^3$, $R^4$, X, and c are as defined and exemplified above, include, but are not limited to, compounds having the following formulae: $Cl_3Si(CH_2)_2SiCl_3$, $Cl_3Si(CH_2)_3SiCl_3$, $Cl_3Si(CH_2)_4SiCl_3$, $Cl_3Si(CH_2)_5SiCl_3$, $Cl_3Si(CH_2)_6SiCl_3$, $Cl_3Si(CH_2)_8SiCl_3$, $Cl_3Si(CH_2)_{10}SiCl_3$, $Cl_3SiC_6H_4SiCl_3$, $Br_3Si(CH_2)_2SiBr_3$, $Br_3Si(CH_2)_3SiBr_3$, $Br_3Si(CH_2)_4SiBr_3$, $Br_3Si(CH_2)_5SiBr_3$, $Br_3Si(CH_2)_6SiBr_3$, $Br_3Si(CH_2)_8SiBr_3$, $Br_3Si(CH_2)_{10}SiBr_3$, $Br_3SiC_6H_4SiBr_3$, $Cl_2MeSi(CH_2)_2SiMeCl_2$, $Cl_2MeSi(CH_2)_3SiMeCl_2$, $Cl_2MeSi(CH_2)_4SiMeCl_2$, $Cl_2MeSi(CH_2)_5SiMeCl_2$, $Cl_2MeSi(CH_2)_6SiMeCl_2$, $Cl_2MeSi(CH_2)_8SiMeCl_2$, $Cl_2MeSi(CH_2)_{10}SiMeCl_2$, and $Cl_2MeSiC_6H_4SiMeCl_2$.

Examples of trivalent organic groups represented by $R^5$ include, but are not limited to, propane-1,2,3-triyl, butane-1,2,3-triyl, butane-1,2,4-triyl, pentane-1,2,3-triyl, pentane-1,3,4-triyl, pentane-1,3,5-triyl, hexane-1,2,3-triyl, hexane-1,2,4-triyl, hexane-1,2,6-triyl, hexane-1,3,4-triyl, hexane-1,3,6-triyl, octane-1,2,3-triyl, octane-1,3,6-triyl, octane-1,3,8-triyl, octane-1,4,6-triyl, octane-1,4,8-triyl, cyclohexane-1,2,3-triyl, cyclohexane-1,2,4-triyl, cyclohexane-1,2,5-triyl, cyclohexane-1,3,5-triyl, benzene-1,2,4-triyl, benzene-1,2,5-triyl, and benzene-1,3,5-triyl.

Examples of organic compounds having the formula $R^5(SiR^3{}_cX_{3-c})_3$ wherein $R^3$, $R^5$, X, and c are as defined and exemplified above, include, but are not limited to, compounds having the following formulae: $Cl_3SiCH_2CH(SiCl_3)CH_2SiCl_3$, $Cl_3SiCH_2CH(SiCl_3)CH(SiCl_3)CH_3$, $Cl_3SiCH_2CH(SiCl_3)CH_2CH_2(SiCl_3)$, $Cl_3SiCH_2CH_2CH(SiCl_3)CH_2CH_2SiCl_3$, $Cl_3SiCH_2CH(SiCl_3)CH_2CH_2CH_2SiCl_3$, $Cl_3SiCH_2CH(SiCl_3)CH(SiCl_3)CH_2CH_2CH_3$, $Br_3SiCH_2CH(SiBr_3)CH_2SiBr_3$, $Br_3SiCH_2CH(SiBr_3)CH(SiBr_3)CH_3$, $Br_3SiCH_2CH(SiBr_3)CH_2CH_2(SiBr_3)$, $Br_3SiCH_2CH(SiBr_3)CH_2CH_2SiBr_3$, $Br_3SiCH_2CH(SiBr_3)CH_2CH_2CH_2SiBr_3$, $Br_3SiCH_2CH(SiBr_3)CH(SiBr_3)CH_2CH_2CH_3$, $(MeO)_3SiCH_2CH(Si(OMe)_3)CH_2Si(OMe)_3$, $(MeO)_3SiCH_2CH(Si(OMe)_3)CH(Si(OMe)_3)CH_3$; $(MeO)_3SiCH_2CH(Si(OMe)_3)CH_2CH_2(Si(OMe)_3)$, $(MeO)_3SiCH_2CH(Si(OMe)_3)CH_2CH_2Si(OMe)_3$, $(MeO)_3SiCH_2CH(Si(OMe)_3)CH_2CH_2CH_2Si(OMe)_3$, and $(MeO)_3SiCH_2CH(Si(OMe)_3)CH(Si(OMe)_3)CH_2CH_2CH_3$.

Examples of tetravalent organic groups represented by $R^6$ include, but are not limited to, butane-1,2,3,4-tetrayl, pentane-1,2,3,4-tetrayl, pentane-1,2,3,5-tetrayl, pentane-1,2,4,5-tetrayl, hexane-1,2,3,4-tetrayl, hexane-1,2,3,5-tetrayl, hexane-1,2,3,6-tetrayl, hexane-1,3,4,5-tetrayl, hexane-1,3,4,6-tetrayl, octane-1,2,3,4-tetrayl, octane-1,2,3,6-tetrayl, octane-1,2,3,8-tetrayl, octane-1,3,4,6-tetrayl, octane-1,3,4,8-tetrayl, cyclohexane-1,2,3,4-tetrayl, cyclohexane-1,2,3,5-tetrayl, cyclohexane-1,2,4,5-tetrayl, phenylene-1,2,3,4-tetrayl, phenylene-1,2,3,5-tetrayl, and phenylene-1,2,4,5-tetrayl.

Examples of organic compounds having the formula $R^6(SiR^3_cX_{3-c})_4$ wherein $R^3$, $R^6$, X, and c are as defined and exemplified above, include, but are not limited to, compounds having the following formulae: $Cl_3SiCH_2CH(SiCl_3)CH(SiCl_3)CH_2(SiCl_3)$, $Cl_3SiCH_2CH_2(SiCl_3)CH(SiCl_3)CH(SiCl_3)CH_3$, $Cl_3SiCH_2CH_2(SiCl_3)CH(SiCl_3)CH_2CH_2SiCl_3$; $Cl_3SiCH_2CH_2(SiCl_3)CH_2CH(SiCl_3)CH_2SiCl_3$, $Cl_3SiCH_2CH(SiCl_3)CH(SiCl_3)CH(SiCl_3)CH_2CH_3$, $Cl_3SiCH_2CH(SiCl_3)CH(SiCl_3)CH_2CH(SiCl_3)CH_3$, $Cl_3SiCH_2CH(SiCl_3)CH(SiCl_3)CH_2CH_2CH_2SiCl_3$, $Cl_3SiCH_2CH(SiCl_3)CH_2CH(SiCl_3)CH(SiCl_3)CH_3$, $Cl_3SiCH_2CH(SiCl_3)CH_2CH_2CH(SiCl_3)CH_2SiCl_3$, $Br_3SiCH_2CH(SiBr_3)CH(SiBr_3)CH_2(SiBr_3)$, $Br_3SiCH_2CH_2(SiBr_3)CH(SiBr_3)CH(SiBr_3)CH_3$, $Br_3SiCH_2CH_2(SiBr_3)CH(SiBr_3)CH_2CH_2SiBr_3$; $Br_3SiCH_2CH_2(SiBr_3)CH_2CH(SiBr_3)CH_2SiBr_3$; $Br_3SiCH_2CH(SiBr_3)CH(SiBr_3)CH(SiBr_3)CH_2CH_3$, $Br_3SiCH_2CH(SiBr_3)CH(SiBr_3)CH_2CH(SiBr_3)CH_3$, $Br_3SiCH_2CH(SiBr_3)CH(SiBr_3)CH_2CH_2CH_2SiBr_3$, $Br_3SiCH_2CH(SiBr_3)CH_2CH(SiBr_3)CH(SiBr_3)CH_3$, $Br_3SiCH_2CH(SiBr_3)CH_2CH_2CH(SiBr_3)CH_2SiBr_3$, $(MeO)_3SiCH_2CH(Si(OMe)_3)CH(Si(OMe)_3)CH_2(Si(OMe)_3)$, $(MeO)_3SiCH_2CH_2(Si(OMe)_3)CH(Si(OMe)_3)CH(Si(OMe)_3)CH_3$, $(MeO)_3SiCH_2CH_2(Si(OMe)_3)CH(Si(OMe)_3)CH_2CH_2Si(OMe)_3$, $(MeO)_3SiCH_2CH_2(Si(OMe)_3)CH_2CH(Si(OMe)_3)CH_2Si(OMe)_3$, $(MeO)_3SiCH_2CH(Si(OMe)_3)CH(Si(OMe)_3)CH(Si(OMe)_3)CH_2CH_3$, $(MeO)_3SiCH_2CH(Si(OMe)_3)CH(Si(OMe)_3)CH_2CH(Si(OMe)_3)CH_3$, $(MeO)_3SiCH_2CH(Si(OMe)_3)CH(Si(OMe)_3)CH_2CH_2CH_2Si(OMe)_3$; $(MeO)_3SiCH_2CH(Si(OMe)_3)CH_2CH(Si(OMe)_3)CH(Si(OMe)_3)CH_3$, and $(MeO)_3SiCH_2CH(Si(OMe)_3)CH_2CH_2CH(Si(OMe)_3)CH_2Si(OMe)_3$.

The organic compound can also be a polymer having an average of at least two silyl groups per molecule. The polymer can be a homopolymer containing identical repeat units or a copolymer containing two or more different repeat units. In a copolymer, the units can be in any order. For example, the polymer can be a random, alternating, or block copolymer.

The polymer typically has a number-average molecular weight of from 500 to 100,000, alternatively from 1000 to 10,000, alternatively from 2000 to 5000.

Examples of polymers include, but are not limited to, polymers having the following formulae: —[CH(OCH$_2$CH$_2$SiCl$_3$)CH$_2$]—, —[CH(OCH$_2$CH$_2$CH$_2$SiCl$_3$)CH$_2$]—, —[CH(C$_6$H$_4$OCH$_2$CH$_2$SiCl$_3$)CH$_2$]—, —[CH(C$_6$H$_4$OCH$_2$CH$_2$CH$_2$SiCl$_3$)CH$_2$]—, —[Si(CH$_3$)(CH$_2$CH$_2$SiCl$_3$)O]—, —[CH(OCH$_2$CH$_2$SiBr$_3$)CH$_2$]—; —[CH(OCH$_2$CH$_2$CH$_2$SiBr$_3$)CH$_2$]—; —[CH(C$_6$H$_4$OCH$_2$CH$_2$SiBr$_3$)CH$_2$]—, —[CH(C$_6$H$_4$OCH$_2$CH$_2$CH$_2$SiBr$_3$)CH$_2$]—, —[Si(CH$_3$)(CH$_2$CH$_2$SiBr$_3$)O]—, —[CH(OCH$_2$CH$_2$Si(OMe)$_3$)CH$_2$]—, —[CH(OCH$_2$CH$_2$CH$_2$Si(OMe)$_3$)CH$_2$]—, —[CH(C$_6$H$_4$OCH$_2$CH$_2$Si(OMe)$_3$)CH$_2$]—, —[CH(C$_6$H$_4$OCH$_2$CH$_2$CH$_2$Si(OMe)$_3$)CH$_2$]—, and —[Si(CH$_3$)(CH$_2$CH$_2$Si(OMe)$_3$)O]—, where the polymer has a number-average molecular weight of from 500 to 100,000.

The cross-linking agent (b)(ii) can be a single organic compound or a mixture comprising two or more different organic compounds, each as described and exemplified above. Moreover, methods of preparing organic compounds having silyl groups are well known in the art.

The cross-linking agent (b)(iii) is a mixture comprising (b)(i) and (b)(ii), each as described and exemplified above.

The thiophenyl-substituted silane and cross-linking agent are reacted with water in the presence of an organic solvent. The organic solvent can be any aprotic or dipolar aprotic organic solvent that is partially miscible or immiscible with water, does not react with the thiophenyl-substituted silane (a), the cross-linking agent (b), or the hydrolysis product under the conditions of the present method, and is miscible with the thiophenyl-substituted silane (a), the cross-linking agent (b), and the hydrolysis product. As used herein, the term "partially miscible" means that the solubility of water in the solvent is less than about 0.1 g/100 g of solvent at 25° C.

Examples of organic solvents include, but are not limited to, saturated aliphatic hydrocarbons such as n-pentane, hexane, n-heptane, isooctane and dodecane; cycloaliphatic hydrocarbons such as cyclopentane and cyclohexane; aromatic hydrocarbons such as benzene, toluene, xylene and mesitylene; cyclic ethers such as tetrahydrofuran (THF) and dioxane; ketones such as methyl isobutyl ketone (MIBK); halogenated alkanes such as trichloroethane; and halogenated aromatic hydrocarbons such as bromobenzene and chlorobenzene. The organic solvent can be a single organic solvent or a mixture comprising two or more different organic solvents, each as described above.

The reaction of the thiophenyl-substituted silane (a) and the cross-linking agent (b) with water can be carried out in any standard reactor suitable for contacting organohalosilanes with water. Suitable reactors include glass and Teflon-lined glass reactors. Preferably, the reactor is equipped with a means of agitation, such as stirring.

The thiophenyl-substituted silane (a), the cross-linking agent (b), and water are typically combined by adding the water to a mixture of components (a), (b), and the organic solvent. Reverse addition, i.e., addition of the thiophenyl-substituted silane (a) and the cross-linking agent (b) to water is also possible. However, reverse addition may result in formation of a gel.

The rate of addition of water to the thiophenyl-substituted silane (a) and the cross-linking agent (b) is typically from 0.1 to 1 mL/min. for a 1000-mL reaction vessel equipped with an efficient means of stirring. When the rate of addition is too slow, the reaction time is unnecessarily prolonged. When the rate of addition is too fast, the reaction mixture may form a gel.

The reaction of the thiophenyl-substituted silane (a) and the cross-linking agent (b) with water is typically carried out at a temperature of from −78 to 25° C., alternatively from −78 to 0° C., alternatively from −78 to −50° C.

The reaction time depends on several factors, including the structures of the thiophenyl-substituted silane (a) and the cross-linking agent (b), and the temperature. The reaction is typically carried out for an amount of time sufficient to complete hydrolysis of the thiophenyl-substituted silane (a) and the cross-linking agent (b). As used herein, the term "to complete hydrolysis" means that at least 85 mol % of the silicon-bonded groups —X originally present in the thiophenyl-substituted silane (a) and the cross-linking agent (b) are converted to silicon-bonded hydroxy groups. For example, the reaction time is typically from 10 to 240 min., alternatively from 30 to 180 min., alternatively from 60 to 120 min., at a temperature of from −78 to −50° C. The optimum reaction time can be determined by routine experimentation using the methods set forth in the Examples section below.

The concentration of the thiophenyl-substituted silane (a) is typically from 50 to 95 mol %, alternatively from 60 to 90 mol %, alternatively from 70 to 80 mol %, based on the sum of the number of moles of components (a) and (b).

The concentration of the organic solvent is typically from 50 to 90% (w/w), alternatively from 60 to 80% (w/w), alternatively from 70 to 75% (w/w), based on the total weight of the reaction mixture.

The concentration of water in the reaction mixture is typically sufficient to effect hydrolysis of the thiophenyl-substituted silane (a) and the cross-linking agent (b). For example, the concentration of water is typically such that the ratio of the number of moles of water to the sum of the number of moles of the silicon-bonded groups —X in the thiophenyl-substituted silane (a) and the cross-linking agent (b) is from 1 to 10, alternatively from 2 to 5.

When the thiophenyl-substituted silane (a) and the cross-linking agent (b) contain hydrolysable groups that do not react with water to form an acid or a base, the reaction mixture can further comprise at least one hydrolysis catalyst. The hydrolysis catalyst can be any acid catalyst or basic catalyst typically used to catalyze the hydrolysis of organosilanes containing hydrolysable groups that do not react with water to form an acid or a base.

Examples of acid catalysts include, but are not limited to, inorganic acids such as hydrochloric acid, sulfuric acid, nitric acid, and hydrofluoric acid; and organic acids such as acetic acid, oxalic acid, and trifluoroacetic acid. The acid catalyst can be a single acid catalyst or a mixture comprising two or more different acid catalysts.

Examples of alkali catalysts include, but are not limited to, inorganic bases such as ammonium hydroxide; and organic bases such as tetramethylammonium hydroxide, tetrabutylammonium hydroxide, and tetrabutylphosphonium hydroxide. The alkali catalyst can be a single alkali catalyst or a mixture comprising two or more different alkali catalysts.

In the method of preparing the hydrolysis product, the organic phase containing the hydrolysis product is separated from the aqueous phase. This separation can be achieved using conventional methods. For example, the organic phase can be separated from the aqueous phase by discontinuing agitation of the mixture, allowing the mixture to separate into two layers, an organic phase and an aqueous phase, and removing the organic phase containing the hydrolysis product. The organic phase is typically washed with water until the wash has a neutral pH. Residual water can be removed from the organic phase using conventional methods such as evaporation under reduced pressure. In this case, the organic solvent typically either forms a minimum boiling azeotrope with water or has a boiling point greater than the boiling point of water. Otherwise, the organic solvent may be completely removed before water during the evaporation process.

Component (B) of the silicone composition is at least one organic solvent. The organic solvent can be any aprotic or dipolar aprotic organic solvent that is partially miscible or immiscible with water, does not react with the hydrolysis product, and is miscible with the hydrolysis product, component (A). As used herein, the term "partially miscible" means that the solubility of water in the solvent is less than about 0.1 g/100 g of solvent at 25° C. Examples of organic solvents are as described above in the method of preparing the hydrolysis product. The organic solvent can be the same organic solvent used to prepare the hydrolysis product or a different organic solvent.

The concentration of component (B) is typically from 80 to 99.9% (w/w), alternatively form 90 to 99.5% (w/w), alternatively from 95 to 99% (w/w), based on the total weight of the silicone composition.

An organic light-emitting diode according to the present invention comprises:
a substrate having a first opposing surface and a second opposing surface;
a first electrode layer overlying the first opposing surface;
a light-emitting element overlying the first electrode layer, the light-emitting element comprising
an emissive/electron-transport layer, and
a hole-transport/hole-injection layer, wherein the hole-transport/hole-injection layer comprises a cured polysiloxane prepared by applying a silicone composition to form a film and curing the film, wherein the silicone composition comprises (A) a hydrolysis product prepared by reacting (a) at least one thiophenyl-substituted silane having the formula Th—$(CH_2)_{m+2}SiR^1{}_nX_{3-n}$, and (b) a cross-linking agent selected from (i) at least one silane having the formula $(R^3{}_bSiX_{4-b})$, (ii) at least one organic compound having an average of at least two silyl groups per molecule, wherein the silyl groups have the formula —$SiR^3{}_cX_{3-c}$, and (iii) a mixture comprising (i) and (ii), with water in the presence of an organic solvent to form an organic phase containing the hydrolysis product and an aqueous phase, and separating the organic phase from the aqueous phase, wherein $R^1$ is $C_1$ to $C_{10}$ hydrocarbyl free of aliphatic unsaturation, X is a hydrolysable group, Th is thiophenyl or substituted thiophenyl, $R^3$ is $C_1$ to $C_{10}$ hydrocarbyl or —H, m is 0 to 10, n is 0, 1, or 2, b is 0 or 1, and c is 0, 1, or 2; and (B) an organic solvent; and
a second electrode layer overlying the light-emitting element.

The substrate has a first opposing surface and a second opposing surface. Also, the substrate can be a rigid or flexible material. Further, the substrate can be transparent or non-transparent to light in the visible region of the electromagnetic spectrum. As used herein, the term "transparent" means the particular component (e.g., substrate or electrode layer) has a percent transmittance of at least 30%, alternatively at least 60%, alternatively at least 80%, for light in the visible region (~400 to ~700 nm) of the electromagnetic spectrum. Also, as used herein, the term "nontransparent" means the component has a percent transmittance less than 30% for light in the visible region of the electromagnetic spectrum.

Examples of substrates include, but are not limited to, semiconductor materials such as silicon, silicon having a surface layer of silicon dioxide, and gallium arsenide; quartz; fused quartz; aluminum oxide; ceramics; glass; metal foils; polyolefins such as polyethylene, polypropylene, polystyrene, and polyethyleneterephthalate; fluorocarbon polymers such as polytetrafluoroethylene and polyvinylfluoride; polyamides such as Nylon; polyimides; polyesters such as poly(methyl methacrylate) and poly(ethylene 2,6-naphthalenedicarboxylate); epoxy resins; polyethers; polycarbonates; polysulfones; and polyether sulfones.

The first electrode layer can function as an anode or cathode in the OLED. The first electrode layer may be transparent or nontransparent to visible light. The anode is typically selected from a high work-function (>4 eV) metal, alloy, or metal oxide such as indium oxide, tin oxide, zinc oxide, indium tin oxide (no), indium zinc oxide, aluminum-doped zinc oxide, nickel, and gold. The cathode can be a low work-function (<4 eV) metal such as Ca, Mg, and Al; a high work-function (>4 eV) metal, alloy, or metal oxide, as described above; or an alloy of a low-work function metal and at least one other metal having a high or low work-function, such as Mg—Al, Ag—Mg, Al—Li, In—Mg, and Al—Ca. Methods of depositing anode and cathode layers in the fabrication of OLEDs, such as evaporation, co-evaporation, DC magnetron sputtering, or RF sputtering, are well known in the art.

The light-emitting element layer overlies the first electrode layer. The light-emitting element comprises a hole-transport/hole-injection layer and an emissiveve/electron-transport layer, wherein the hole-transport/hole-injection layer comprises a cured polysiloxane, described below. The orientation of the light-emitting element depends on the relative positions of the anode and cathode in the OLED. The hole-transport/hole-injection layer is located between the anode and the emissive/electron-transport layer, and the emissive/electron-transport layer is located between the hole-transport/hole-injection layer and the cathode. The thickness of the hole-transport/hole-injection layer is typically from 2 to 100 nm, alternatively from 30 to 50 nm. The thickness of the emissive/electron-transport layer is typically from 20 to 100 nm, alternatively from 30 to 70 nm.

The hole-transport/hole-injection-layer comprises a cured polysiloxane prepared by applying a silicone composition to form a film and curing the film, wherein the silicone composition is as described above.

A silicone composition is applied to the first electrode layer, a layer overlying the first electrode layer, or the emissive/electron-transport layer, depending on the configuration of the OLED, to form a film, wherein the silicone comprises components (A) and (B), described below.

The silicone composition can be applied to the first electrode layer, a layer overlying the first electrode layer, or the emissive/electron-transport layer using conventional methods such as spin-coating, dipping, spraying, brushing, and printing.

The film can be cured by exposing it to heat. The rate of cure depends on a number of factors, including the structure of the hydrolysis product and the temperature. Partially cured polysiloxanes generally have a higher content of silicon-bonded hydroxy (silanol) groups than more completely cured polysiloxanes. The extent of cure can be varied by controlling cure time and temperature. For example, the silicone composition typically can be cured by exposing the composition to a temperature of from about 150° C. to about 250° C., for period from 0.1 to 1 h.

The emissive/electron-transport layer can be any low molecular weight organic compound or organic polymer typically used as an emissive, electron-transport, electron-injection/electron-transport, or light-emitting material in OLED devices. Low molecular weight organic compounds suitable for use as the electron-transport layer are well known in the art, as exemplified in U.S. Pat. No. 5,952,778; U.S. Pat. No. 4,539,507; U.S. Pat. No. 4,356,429; U.S. Pat. No. 4,769,292; U.S. Pat. No. 6,048,573; and U.S. Pat. No. 5,969,474. Examples of low molecular weight compounds include, but are not limited to, aromatic compounds, such as anthracene, naphthalene, phenanthrene, pyrene, chrysene, and perylene; butadienes such as 1,4-diphenylbutadiene and tetraphenylbutadiene; coumarins; acridine; stilbenes such as trans-stilbene; and chelated oxinoid compounds, such as tris(8-hydroxyquinolato)aluminum(III), $Alq_3$. These low molecular weight organic compounds may be deposited by standard thin-film preparation techniques including vacuum evaporation and sublimation.

Organic polymers suitable for use as the emissive/electron-transport layer are well known in the art, as exemplified in U.S. Pat. No. 5,952,778; U.S. Pat. No. 5,247,190; U.S. Pat. No. 5,807,627; U.S. Pat. No. 6,048,573; and U.S. Pat. No. 6,255,774. Examples of organic polymers include, but are not limited to, poly(phenylene vinylene)s, such as poly(1,4 phenylene vinylene); poly-(2,5-dialkoxy-1,4 phenylene vinylene)s, such as poly(2-methoxy-5-(2-ethylhexyloxy)-1,4-phenylenevinylene) (MEHPPV), poly(2-methoxy-5-(2-methylpentyloxy)-1,4-phenylenevinylene), poly(2-methoxy-5-pentyloxy-1,4-phenylenevinylene), and poly(2-methoxy-5-dodecyloxy-1,4-phenylenevinylene); poly(2,5-dialkyl-1,4 phenylene vinylene)s; poly(phenylene); poly(2,5-dialkyl-1,4 phenylene)s; poly(p-phenylene); poly(thiophene)s, such as poly(3-alkylthiophene)s; poly(alkylthienylene)s, such as poly(3-dodecylthienylene); poly(fluorene)s, such as poly(9,9-dialkyl fluorine)s; and polyanilines. Examples of organic polymers also include the polyfluorene-based light-emitting polymers available from Suamtion (Tokyo, Japan), under the trademark Sumation, such as Sumation™ Blue BP105 Light Emitting Polymer, Sumation™ Green K2 Light Emitting Polymer, and Sumation™ Red H2 Light Emitting Polymer. The organic polymers can be applied by conventional solvent coating techniques such as spin-coating, dipping, spraying, brushing, and printing (e.g., stencil printing and screen printing).

The emissive/electron-transport layer can further comprise a fluorescent dye. Fluorescent dyes suitable for use in OLED devices are well known in the art, as illustrated in U.S. Pat. No. 4,769,292. Examples of fluorescent dyes include, but are not limited to, coumarins; dicyanomethylenepyrans, such as 4-(dicyanomethylene)-2-methyl-6-(p-dimethylaminostyryl) 4H-pyran; dicyanomethylenethiopyrans; polymethine; oxabenzanthracene; xanthene; pyrylium and thiapyrylium; cabostyril; and perylene fluorescent dyes.

The second electrode layer can function either as an anode or cathode in the OLED. The second electrode layer may be transparent or nontransparent to light in the visible region. Examples of anode and cathode materials and methods for their formation are as described above for the first electrode layer.

The OLED of the present invention can further comprise an electron-injection layer interposed between the cathode and the emissive/electron-transport layer. The electron-injection layer typically has a thickness of from 0.5 to 5 nm, alternatively from 1 to 3 nm. Examples of materials suitable for use as the electron-injection layer include, but are not limited to, alkali metal fluorides, such as lithium fluoride and cesium fluoride; and alkali metal carboxylates, such as lithium acetate and cesium acetate. The electron-injection layer can be formed by conventional techniques, thermal evaporation.

The OLED of the present invention can further comprise a hole-transport layer interposed between the anode and the hole-transport/hole-injection layer. The hole-transport layer can be any organic compound typically used as a hole-transport, hole-injection, or hole-injection/hole-transport material in OLED devices. Organic compounds suitable for use as the hole-transport layer are well known in the art, as exemplified in U.S. Pat. No. 4,720,432; U.S. Pat. No. 5,593,788; U.S. Pat. No. 5,969,474; U.S. Pat. No. 4,539,507; U.S. Pat. No. 6,048,573; and U.S. Pat. No. 4,888,211. Examples of organic compounds include, but are not limited to, aromatic tertiary amines, such as monoarylamines, diarylamines, triarylamines, and tetraaryldiamines; hydrazones; carbazoles; triazoles; imidazoles; oxadiazoles having an amino group; polythiophenes, such as poly(3,4-ethylenedioxythiophene) poly (styrenesulfonate), which is sold under the name Baytron® P by H.C. Starck Inc.; and porhyrinic compounds, such as phthalocyanines and metal-containing phthalocyanines. The organic compounds can be applied by conventional thin-film preparation techniques including vacuum evaporation and sublimation.

As shown in FIG. 1, a first embodiment of an OLED according to the present invention comprises a substrate 100 having a first opposing surface 100A and a second opposing surface 100B, a first electrode layer 102 overlying the first opposing surface 100A, wherein the first electrode layer 102 is an anode, a light-emitting element 104 overlying the first electrode layer 102, wherein the light-emitting element 104 comprises a hole-transport/hole-injection layer 106 and an emissive/electron-transport layer 108 lying on the hole-transport/hole injection layer 106, wherein the hole-transport/hole-injection layer 106 comprises a cured polysiloxane, and a second electrode layer 110 overlying the light-emitting element 104, wherein the second electrode layer 110 is a cathode.

As shown in FIG. 2, a second embodiment of an OLED according to the present invention comprises a substrate 200 having a first opposing surface 200A and a second opposing surface 200B, a first electrode layer 202 overlying the first opposing surface 200A, wherein the first electrode layer 202 is a cathode, a light-emitting element 204 overlying the first electrode layer 202, wherein the light-emitting element 204 comprises an emissive/electron-transport layer 208 and a hole-transport/hole-injection layer 206 lying on the emissive/electron-transport layer 208, wherein the hole-transport/hole-injection layer 206 comprises a cured polysiloxane, and a second electrode layer 210 overlying the light-emitting element 204, wherein the second electrode layer 210 is an anode.

The OLED of the present invention has a low turn-on voltage and high brightness. Also, the hole-transport/hole-injection layer of the present invention, which comprises a cured polysiloxane, exhibits high transparency and a neutral pH. Moreover, the hydrolysis product in the silicone composition used to prepare the hole-transport/hole-injection layer is soluble in organic solvents, and the composition has good stability in the absence of moisture.

The organic light-emitting diode of the present invention is useful as a discrete light-emitting device or as the active element of light-emitting arrays or displays, such as flat panel displays. OLED displays are useful in a number of devices, including watches, telephones, lap-top computers, pagers, cellular phones, digital video cameras, DVD players, and calculators.

EXAMPLES

The following examples are presented to better illustrate the silicone composition and OLED of the present invention, but are not to be considered as limiting the invention, which is delineated in the appended claims. Unless otherwise noted, all parts and percentages reported in the examples are by weight. The following methods and materials were employed in the examples:
NMR Spectra Nuclear magnetic resonance spectra ($^1$H NMR) of thiophenyl-substituted silanes in CDCl$_3$ were obtained using a Varian 300 MHz NMR spectrometer.
Preparation of Ito-Coated Glass Substrates Patterned ITO-coated glass substrates measuring 200 mm×200 mm×0.2 mm and having a surface resistance of 15 Ω/square were purchased from Geomatic Co., Ltd. Each substrate has a pattern of three rectangular-shaped layers of ITO (thickness=1500±150 Å) on silicon dioxide (thickness=150±100 Å), each oriented parallel to one another. The substrates were cut into 25-mm square samples.

The substrates were immersed in an ultrasonic bath containing a solution consisting of 1% Alconox powdered cleaner (Alconox, Inc.) in water for 10 min and then rinsed with deionized water. The substrates were then immersed sequentially in the each of the following solvents with ultrasonic agitation for 10 min in each solvent: isopropyl alcohol, n-hexane, and toluene. The glass substrates were then dried under a stream of dry nitrogen. Immediately before use, the substrates were treated with oxygen plasma for 3 min.
Deposition of Ca and Al Films in OLEDs Calcium and aluminum films were deposited by thermal evaporation under an initial vacuum of $10^{-6}$ mbar using a BOC Edwards model E306A Coating System equipped with a crystal balance film thickness monitor. The source was prepared by placing the metal in an aluminum oxide crucible and positioning the crucible in a tungsten wire spiral, or by placing the metal directly in a tungsten basket. When multiple layers of different metals were required, the appropriate sources were placed in a turret that could be rotated for deposition of each metal. The deposition rate (0.1 to 0.3 nm per second) and the thickness of the film were monitored during the deposition process.

Platinum Catalyst is a mixture containing 0.05% (w/w) of a platinum(0) complex of 1,3-divinyl-1,1,3,3-tetramethyldisiloxane in anhydrous toluene.

Sumation™ Blue BP105 Light Emitting Polymer, available from Sumation (Tokyo, Japan), is a polyfluorene polymer that emits light in the blue region of the visible spectrum.

Sumation™ Green K2 Light Emitting Polymer, available from Sumation (Tokyo, Japan), is a polyfluorene polymer that emits light in the green region of the visible spectrum.

Sumation™ Red H2 Light Emitting Polymer, available from Sumation (Tokyo, Japan), is a polyfluorene polymer that emits light in the red region of the visible spectrum.

Example 1

2-Allylthiophene (25 g), 13 g of anhydrous toluene (13 g), and 250 mg of Platinum Catalyst were combined under nitrogen in a three-neck flask equipped with a reflux condenser and a dropping funnel. Then, 30 g of trichlorosilane was added drop-wise to the mixture. Upon completion of the addition, the mixture was heated to 60° C. and maintained at that temperature for 2 h. Then, the mixture was distilled at 150° C. and 0.02 ton to give 2-(3-trichlorosilylpropyl)thiophene as a colorless liquid: $^1$H NMR (CDCl$_3$) δ 7.16 (dd, 1H, J=5.1, 0.9 Hz); 6.95 (dd, 1H, J=4.8, 3.3 Hz); 6.83 (m, 1H); 2.96 (t, 2H, J=7.2 Hz); 1.98 (m, 2H); 1.46 (m, 2H).

2-(3-Trichlorosilylpropyl)thiophene (5.0 g) and 50 g of methyl isobutyl ketone were combined in a flask. Then, 400 mg of silicon tetrachloride and 430 mg of 1,8-bis(trichlorosilyl)octane were added to the solution. The resulting mixture was cooled at −78° C. for 1 h. Next, 10 g of water was added to the mixture during a period of 1 h. When the addition of water was complete, the mixture was allowed to slowly warm to room temperature. The mixture was washed with water until the washings were no longer acidic. Residual water was removed in vacuo and the mixture was filtered using a 0.1 μm PTFE syringe filter.

Example 2

The hydrosilylation reaction of Example 1 was repeated using 18.7 g of 5-allyl-2,2'-bithiophene in place of 2-allylthiophene, 10 g of anhydrous toluene, 20 g of trichlorosilane, and 150 mg of Platinum Catalyst. 5-(3-Trichlorosilylpropyl)-2,2'-bithiophene was obtained as a colorless liquid: $^1$H NMR (CDCl$_3$) δ 7.20 (dd, 1H, J=5.1, 1.2 Hz); 7.14 (dd, 1H, J=3.6, 0.9 Hz); 7.02 (m, 2H); 6.74 (d, 1H, J=3.6 Hz); 2.93 (t, 2H, J=7.2 Hz); 1.99 (m, 2H); 1.49 (m, 2H).

The hydrolysis reaction of Example 1 was repeated using 5-(3-trichlorosilylpropyl)-2,2'-bithiophene in place of 2-(3-trichlorosilylpropyl)thiophene.

Example 3

The hydrosilylation reaction of Example 1 was repeated using 4.5 g of 2-allyl-5-methylthiophene in place of 2-allylthiophene, 2.5 g of anhydrous toluene, 5.0 g of trichlorosilane, and 50 mg of Platinum Catalyst. 2-(3-Trichlorosilylpropyl)-5-methylthiophene was obtained as a colorless liquid: $^1$H NMR (CDCl$_3$) δ 6.60 (m, 2H); 2.88 (t, 2H, J=7.2 Hz); 2.47 (s, 3H); 1.95 (m, 2H); 1.47 (m, 2H).

The hydrolysis reaction of Example 1 was repeated using 2-(3-trichlorosilylpropyl)-5-methylthiophene in place of 2-(3-trichlorosilylpropyl)thiophene.

Example 4

The hydrosilylation reaction of Example 1 was repeated using 5.0 g of 5-allyl-5'-methyl-2,2'-bithiophene in place of 2-allylthiophene, 2.5 g of anhydrous toluene, 6.0 g of trichlorosilane, and 50 mg of Platinum Catalyst. 5-(3-Trichlorosilylpropyl)-5'-methyl-2,2'-bithiophene was obtained as a colorless liquid: $^1$H NMR (CDCl$_3$) δ 6.92 (d, 1H, J=3.6 Hz); 6.91 (d, 1H, J=2.7 Hz); 6.70 (d, 2H, J=3.6 Hz); 6.65 (m, 1H); 2.91 (t, 2H, J=7.2 Hz); 2.48 (d, 3H, J=1.2 Hz); 1.97 (m, 2H); 1.47 (m, 2H).

The hydrolysis reaction of Example 1 was repeated using 5-(3-trichlorosilylpropyl)-5'-methyl-2,2'-bithiophene in place of 2-(3-trichlorosilylpropyl)thiophene.

Example 5

Three OLEDs were fabricated as follows: The hydrolysate of Example 1 was diluted to 0.5% (w/w) solids with MIBK. The solution was spin-coated (2000 rpm, 20 s) over an ITO-coated glass substrate, described above, using a CHEMAT Technology Model KW-4A spin-coater to form a hole-transport/hole-injection layer having a thickness of 10 nm. The substrate was heated on a hot plate at 190° C. for 0.5 h. A solution consisting of 1.5 wt % of Sumation™ Blue BP105 Light-Emitting Polymer in xylene was then spin-coated (2250 rpm, 30 second) over the hole-transport/hole-injection layer to form an emissive/electron-transport layer having a thickness of about 70 nm. The substrate was heated on a hot plate at 100° C. for 0.5 h and then allowed to cool to room temperature. Three cathodes were formed by depositing calcium (50 nm) and aluminum (150 nm) sequentially on top of the light-emitting polymer layer through a mask having three rectangular apertures (5 mm×15 mm). A drop of epoxy adhesive (ELC 2500, Electro-Lite Corporation) was then applied on the cathodes. A glass slide was placed upon the epoxy and pressure was applied to spread the epoxy into a uniform layer. The epoxy was cured for 7 min. using a 365-nm UV lamp. The three OLEDs emitted a blue color light and had an average turn-on voltage at 1 cd m$^{-2}$ of about 9.6 V, average brightness at 10 V of approximately 17 cd m$^{-2}$, and average peak luminous efficiency of 0.3 cd/A.

Three OLEDs were prepared using the preceding method, but replacing Sumation™ Blue BP105 with Sumation™ Red H2 Light Emitting Polymer. The OLEDs emitted a red color and had an average turn-on voltage of 8.7 V, average brightness at 10 V of 38 cd m$^{-2}$, and average peak luminous efficiency of 0.10 cd/A.

Finally, three OLEDs were prepared using the preceding method, but replacing Sumation™ Blue BP105 with Sumation™ Green K2 Light Emitting Polymer. The OLEDs emitted a green color and had an average turn-on voltage of 6.2 V, average brightness at 10 V of 650 cd m$^{-2}$, and average peak luminous efficiency of 2.4 cd/A.

Example 6

OLEDS were fabricated as described in Example 5 using the hydrolysate of Example 2. A red-emitting device had an average turn-on voltage of 4.8 V, an average brightness at 10 V of 835 cd m$^{-2}$, and average peak luminous efficiency of 0.35 cd/A. A green-emitting device had an average turn-on voltage of 4.6 V, average brightness at 10 V of 5500 cd m$^{-2}$, and average peak luminous efficiency of 2.7 cd/A. A blue-emitting device had an average turn-on voltage of 5.7 V, average brightness at 10 V of 1380 cd m$^{-2}$, and average peak luminous efficiency of 2.2 cd/A.

Example 7

OLEDS were fabricated as described in Example 5 using the hydrolysate of Example 3. A red-emitting device had an average turn-on voltage of 7.3 V, average brightness at 10 V of 113 cd m$^{-2}$, and average peak luminous efficiency of 0.12 cd/A. A green-emitting device had an average turn-on voltage of 6.2 V, average brightness at 10 V of 977 cd m$^{-2}$, and average peak luminous efficiency of 2.0 cd/A. A blue-emitting device had an average turn-on voltage of >10 V, average brightness at 10 V of 3.6 cd m$^{-2}$, and average peak luminous efficiency of 0.11 cd/A.

Example 8

OLEDS were fabricated as described in Example 5 using the hydrolysate of Example 4. A red-emitting device had an average turn-on voltage of 6.7 V, average brightness at 10 V of 170 cd m$^{-2}$, and average peak luminous efficiency of 0.31 cd/A. A green-emitting device had an average turn-on voltage of 5.6 V, average brightness at 10 V of 1100 cd m$^{-2}$, and average peak luminous efficiency of 1.8 cd/A. A blue-emitting device had an average turn-on voltage of 6.2 V, average brightness at 10 V of 740 cd m$^{-2}$, and average peak luminous efficiency of 1.9 cd/A.

That which is claimed is:

1. A silicone composition comprising:
(A) a hydrolysis product prepared by reacting (a) at least one thiophenyl-substituted silane having the formula Th—(CH$_2$)$_{m+2}$SiR$^1_n$X$_{3-n}$, and (b) a cross-linking agent selected from (i) at least one silane having the formula (R$^3_b$SiX$_{4-b}$), (ii) at least one organic compound having an average of at least two silyl groups per molecule, wherein the silyl groups have the formula —SiR$^3_c$X$_{3-c}$, and (iii) a mixture comprising (i) and (ii), with water in the presence of an organic solvent to form an organic phase containing the hydrolysis product and an aqueous phase, and separating the organic phase from the aqueous phase, wherein R$^1$ is C$_1$ to C$_{10}$ hydrocarbyl free of aliphatic unsaturation, X is a hydrolysable group, Th is thiophenyl or substituted thiophenyl, R$^3$ is C$_1$ to C$_{10}$ hydrocarbyl or —H, m is 0 to 10, n is 0, 1, or 2, b is 0 or 1, and c is 0, 1, or 2; and
(B) an organic solvent.

2. The silicone composition according to claim 1, wherein the subscript m has a value of from 0 to 5.

3. The silicone composition according to claim 1, wherein Th is selected from thiophen-2-yl, 2,2'-bithiophen-5-yl, and 2,2':5',2''-terthiophen-5-yl.

4. The silicone composition according to claim 1, wherein X in the formula of the thiophenyl-substituted silane and the cross-linking agent is selected from —Cl and —Br.

5. An organic light-emitting diode comprising:
a substrate having a first opposing surface and a second opposing surface;
a first electrode layer overlying the first opposing surface;
a light-emitting element overlying the first electrode layer, the light-emitting element comprising
an emissive/electron-transport layer, and
a hole-transport/hole-injection layer, wherein the hole-transport/hole-injection layer comprises a cured polysiloxane prepared by applying a silicone composition to form a film and curing the film, wherein the silicone composition comprises (A) a hydrolysis product prepared by reacting (a) at least one thiophenyl-substituted silane having the formula Th—$(CH_2)_{m+2}SiR^1_nX_{3-n}$, and (b) a cross-linking agent selected from (i) at least one silane having the formula $(R^3_bSiX_{4-b})$, (ii) at least one organic compound having an average of at least two silyl groups per molecule, wherein the silyl groups have the formula —$SiR^3_cX_{3-c}$, and (iii) a mixture comprising (i) and (ii), with water in the presence of an organic solvent to form an organic phase containing the hydrolysis product and an aqueous phase, and separating the organic phase from the aqueous phase, wherein $R^1$ is $C_1$ to $C_{10}$ hydrocarbyl free of aliphatic unsaturation, X is a hydrolysable group, Th is thiophenyl or substituted thiophenyl, $R^3$ is $C_1$ to $C_{10}$ hydrocarbyl or —H, m is 0 to 10, n is 0, 1, or 2, b is 0 or 1, and c is 0, 1, or 2; and
(B) an organic solvent; and
a second electrode layer overlying the light-emitting element.

6. The organic light emitting diode according to claim 5, wherein the subscript m has a value of from 0 to 5.

7. The organic light emitting diode according to claim 5, wherein Th is selected from thiophen-2-yl, 2,2'-bithiophen-5-yl, and 2,2':5',2''-terthiophen-5-yl.

8. The organic light emitting diode according to claim 5, wherein X in the formula of the thiophenyl-substituted silane and the cross-linking agent is selected from —Cl and —Br.

9. The organic light-emitting diode according to claim 5, wherein the emmisive/electron transport layer comprises a fluorescent dye.

10. The organic light-emitting diode according to claim 5, further comprising at least one of a hole-transport layer and an electron injection layer.

* * * * *